United States Patent [19]

Anthony et al.

[11] Patent Number: 5,110,579
[45] Date of Patent: May 5, 1992

[54] TRANSPARENT DIAMOND FILMS AND METHOD FOR MAKING

[75] Inventors: Thomas R. Anthony, Schenectady; James F. Fleischer, Scotia, both of N.Y.

[73] Assignee: General Electric Company, Schenectady, N.Y.

[21] Appl. No.: 407,179

[22] Filed: Sep. 14, 1989

[51] Int. Cl.$^5$ ............................................. C01B 31/06
[52] U.S. Cl. ........................... 423/446; 156/DIG. 68; 501/86; 437/39; 204/179
[58] Field of Search ............ 423/446; 136/DIG. 68; 501/86; 204/173; 427/39

[56] References Cited

U.S. PATENT DOCUMENTS

| | | | |
|---|---|---|---|
| 3,030,187 | 4/1962 | Eversole | 423/446 |
| 3,630,679 | 12/1971 | Angus | 423/446 |
| 4,767,608 | 8/1988 | Matsumoto et al. | 156/DIG. 68 |
| 4,816,286 | 3/1989 | Hirose | 423/446 |
| 4,830,702 | 5/1989 | Singh et al. | 156/DIG. 68 |

FOREIGN PATENT DOCUMENTS

| | | | |
|---|---|---|---|
| 58110494 | 7/1983 | Japan | 423/446 |
| 58135117 | 8/1983 | Japan | 423/446 |
| 5918197 | 1/1984 | Japan | 423/446 |
| 60112699 | 6/1985 | Japan | 501/86 |
| 60118694 | 6/1985 | Japan | 423/446 |
| 60127292 | 7/1985 | Japan | 423/446 |
| 60141697 | 7/1985 | Japan | 423/446 |
| 60186500 | 9/1985 | Japan | 423/446 |
| 63153815 | 6/1988 | Japan | 423/446 |
| 63201601 | 8/1988 | Japan | 423/446 |

OTHER PUBLICATIONS

Karl E. Spear, Diamond-Ceramic Coating of the Future, Journal of the American Ceramic Society (1989), vol. 72, No. 2, pp. 171-191.

Peter K. Bachmann and Russell Messier, Emerging Technology of Diamond Thin Films, Special Report, C&EN, May 15, 1989, pp. 24-39.

*Primary Examiner*—Robert Kunemund
*Attorney, Agent, or Firm*—William A. Teoli; James C. Davis, Jr.; William H. Pittman

[57] ABSTRACT

A method is provided for making substantially transparent polycrystalline diamond film having a thickness greater than 50 microns which can be used in glazing applications and as a heat sink in microelectric applications. A mixture of hydrogen and methane is conveyed into a heated filament reacting zone which is adjacent to an appropriate substrate, such as a molybdenum substrate to produce non-adherent polycrystalline substantially transparent diamond film.

5 Claims, 3 Drawing Sheets

TRANSPARENT DIAMOND FILMS AND METHOD FOR MAKING

BACKGROUND OF THE INVENTION

The present invention relates to vapor deposited transparent polycrystalline diamond films. More particularly, the present invention relates the method of introducing a particular mixture of hydrogen and methane into a heated reaction zone adjacent to a substrate such as molybdenum, to effect polycrystalline diamond film deposition.

As taught by Spear, Diamond-Ceramic Coating Of The Future, Journal of American Ceramics Society, 72[2]171-91 (1989), the growth of single-crystal films of diamond is critical to many electronic and optical applications, but it is a feat that has not been achieved except for homoepitaxial growth on diamond substrates. There is reported by Peter K. Backmann, et al in the May 15, 1989, edition of Chemical and Engineering News, on page 38, that vapor deposited diamond heat sinks have been developed using plasma jet deposition to produce polycrystalline material up to $4 \times 6 \times 1$ millimeter.

In Japanese patent 85,141,697, it is reported that free-standing diamond films have been found useful as diaphragms for speakers. S. Kawachi et al, Japanese patent 85(60)-127,292, reports that 10 micron diamond films have been deposited on a graphite substrate. K. Fujii, et al, Japanese patent 85(60)-186,500 teaches that a 6.5 micron thick transparent film can be produced on a substrate using a methane-hydrogen mixture.

Although various procedures have been developed to make vapor deposited polycrystalline diamond film, it would be desirable to provide glazing materials in the form of free-standing polycrystalline transparent diamond films having thicknesses of from 50 to 5000 microns with lateral dimensions exceeding 10 millimeters.

SUMMARY OF THE INVENTION

The present invention is based on the discovery that vapor deposited transparent polycrystalline diamond film can be made at thicknesses greater than 50 microns by passing a particular hydrogen-methane mixture through a filament heated reaction zone adjacent to a suitable substrate, such as a molybdenum substrate, where the hydrogen-methane mixture introduced into the reaction zone has from about 1.5 to about 2 volume percent of methane, based on the total volume of hydrogen and methane. Surprisingly, a transparent non-adherent polycrystalline diamond film having an optical absorbance of 2.1 cm$^{-1}$ to 32 cm$^{-1}$ can be formed at a growth rate of about 0.4 to 1.0 microns per hours. Thicknesses of at least 500 microns, and as high as 5000 microns or more, can be made having lateral dimensions exceeding 25 centimeters.

STATEMENT OF THE INVENTION

There is provided by the present invention, a continuous free-standing, substantially transparent, polycrystalline diamond film having a thickness of at least 50 microns comprising (A) substantially vertical columnar diamond crystals having an average diameter of from about 20 to about 200 microns and a <110> orientation perpendicular to the base and up to 10,000 parts per million of chemically combined hydrogen which is sufficient to substantially saturate dangling carbon bonds at diamond crystal grain boundaries, carbon dislocations, and carbon vacancies and (B) diamond crystal grain boundaries separating the columnar diamond crystals of (A) where the diamond crystal grain boundaries have a 70°-90° orientation to the diamond crystal base.

In another aspect of the present invention, there is provided a method of growing a non-adherent substantially transparent polycrystalline diamond film on a substrate which comprises, passing a hydrogen-methane mixture through a heated reaction zone at a temperature of about 600° to about 1000° C. and at a pressure from about 3 to about 24 torr which is sufficient to generate active carbon-hydrogen species in the heated reaction zone maintained at a distance of from about 0.3 to about 1 centimeter from the surface of the substrate, where the hydrogen-methane mixture introduced into the heated reaction zone has from 1.5 to about 2 volume percent of methane, based on the total volume of hydrogen and methane.

BRIEF DESCRIPTION OF THE DRAWINGS

A typical apparatus which can be used to form the transparent polycrystalline diamond film of the present invention is shown by FIG. 1.

Figure 2:
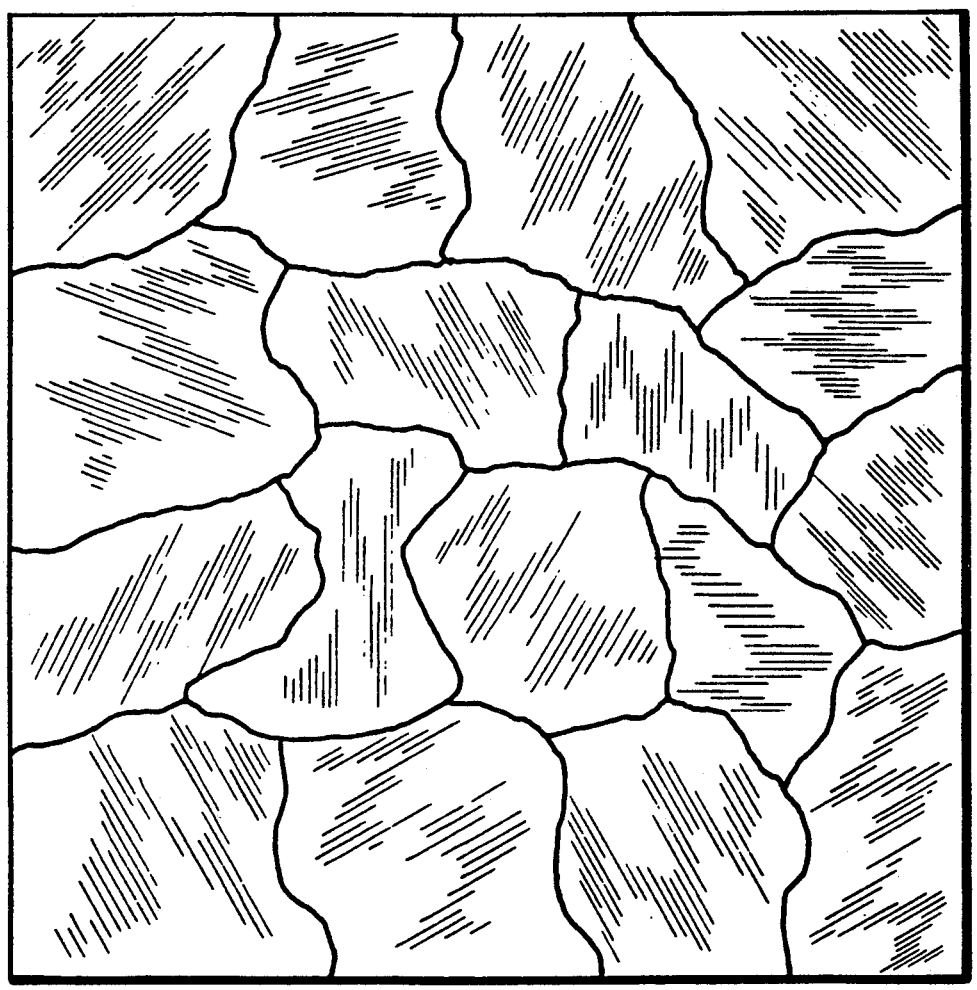

Reference also is made to FIG. 2, showing through an optical microscope, a top view of 10 to 200 micron columnar diamond crystals of the polycrystalline diamond film of the present invention separated by atomic grain boundaries such as shown at 30.

Figure 3:
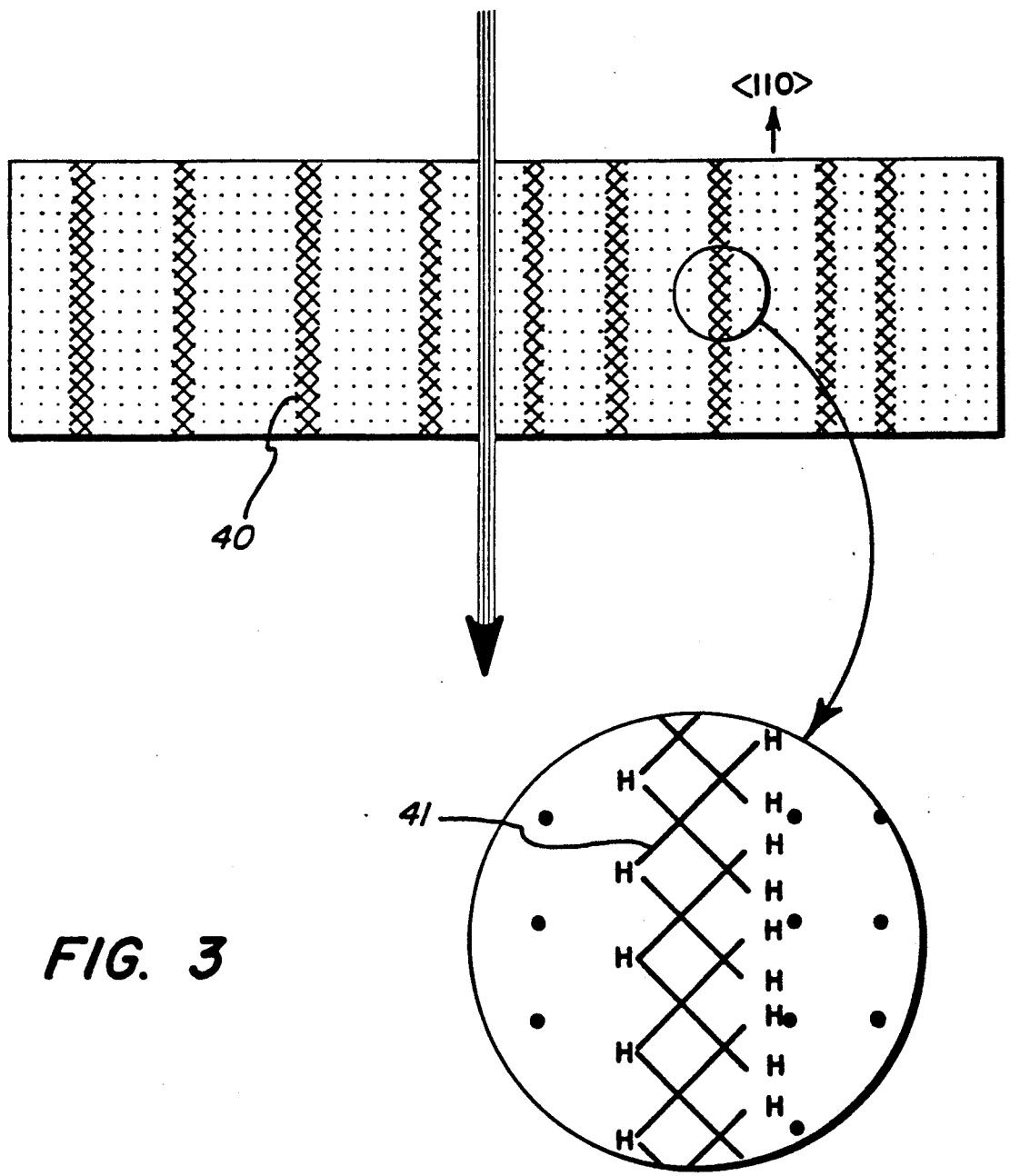

A further reference to the polycrystalline diamond film of the present invention is shown by FIG. 3.

More particularly, there is shown a quartz bell jar at 10 which can be 20"-30" tall and about 4"-6" wide having a metal collar at its base at 11 and a gas inlet at the top at 12. The metal collar portion rests on a rubber seal at 13 which can be Neoprene rubber. The rubber seal is supported by a metal base, such as steel base structure at 14 which has a vacuum opening at 15.

Inside the quartz bell jar there is shown a supporting stand at 16 for an extension at 17 for holding several substrate structures, such as molybdenum at 18 and 19 and a filament at 20. The filament is secured by a screw at 21 to a metal plug at 22 which passes through a quartz insulating collar at 23 which is supported by an extension at 24. Electrical contacts are shown from the plug at 25 to a stud at 26 which is insulated from the metal base at 27.

A side view of the polycrystalline diamond film in cross section, and a detail at 3A further illustrates the substantially transparent columns of diamond crystals having a <110> orientation perpendicular to the base. Grain boundaries between adjacent diamond crystals having hydrogen atoms saturating dangling carbon bonds are shown at 40 and in detail at 41, where at least 50% of the carbon atoms are believed to be tetrahedrally bonded based on Raman spectroscopy, infrared and X-ray analysis.

A detailed discussion of Miller Indices describing crystal planes of atoms differentiating between <010>, <110> and <111> orientation is shown on pages 65-69 in *Elements of Material Science*, Second Edition, 1964, by Lawrence H. VanVlack of Addison-Wisley Publishing Company, Reading, Mass. which is incorporated herein by reference.

A detailed discussion on chemical bonding and structure discussing the hybridization theory and molecular geometry with respect to tetrahedral bonding of carbon atoms with hydrogen is shown by Ernest Griswold, *Chemical Bonding and Structure*, pages 55-102, 1968, Raytheon Education Company, which is incorporated herein by reference.

The following shows that dissociation of hydrogen and methane on a heated tungsten filament in accordance with the practice of the method of the present invention.

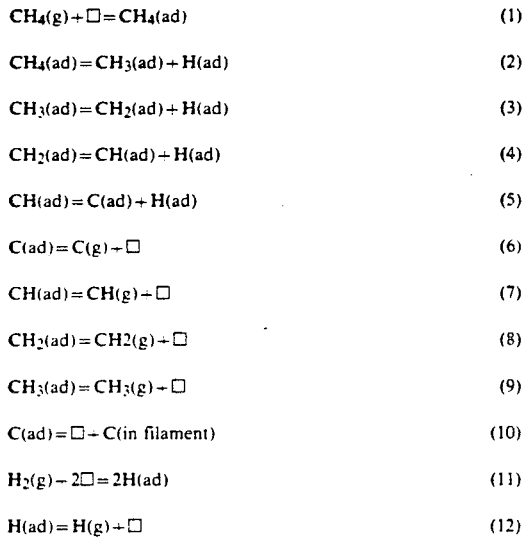

□ = vacant surface site
(g) = gaseous species
(ad) = species absorbed on surface.

The above mechanism is one possible explanation as to how the transparent diamond film grows on the substrate.

As described by Ch. Wild et al. in the *First Proceedings For International ECS Symposium on Diamond and Diamond-Like Films, Los Angeles*, May 7-12, 1989 for "Optical and Structural Characterization of CVD Diamond", which is incorporated herein by reference, infrared and Raman spectroscopy as well as X-ray diffraction have been used to investigate polycrystalline diamond films prepared by the method of the present invention. The absorption spectrum of a 400 micron thick free-standing diamond wafer established that the film had a hydrogen concentration of about 5000 part per million. Raman spectroscopy was used to establish that the observed polycrystalline film was significantly different from graphite, since it contained a significant level of tetrahydral carbon atoms. X-ray diffraction measurements revealed that the polycrystalline film made in accordance with the practice of the present invention had a preferential alignment of the <110> planes perpendicular to the growth direction and indicated that the diamond crystal grain boundaries had a 70°-90° orientation to the base.

The polycrystalline diamond films made in accordance with the practice of the present invention can be used in a variety of glazing applications as well as heat sinks or semiconductors.

In order that those skilled in the art will be better able to practice the present invention, the following example is given by way of illustration and not by way of limitation.

EXAMPLE

Figure 1:
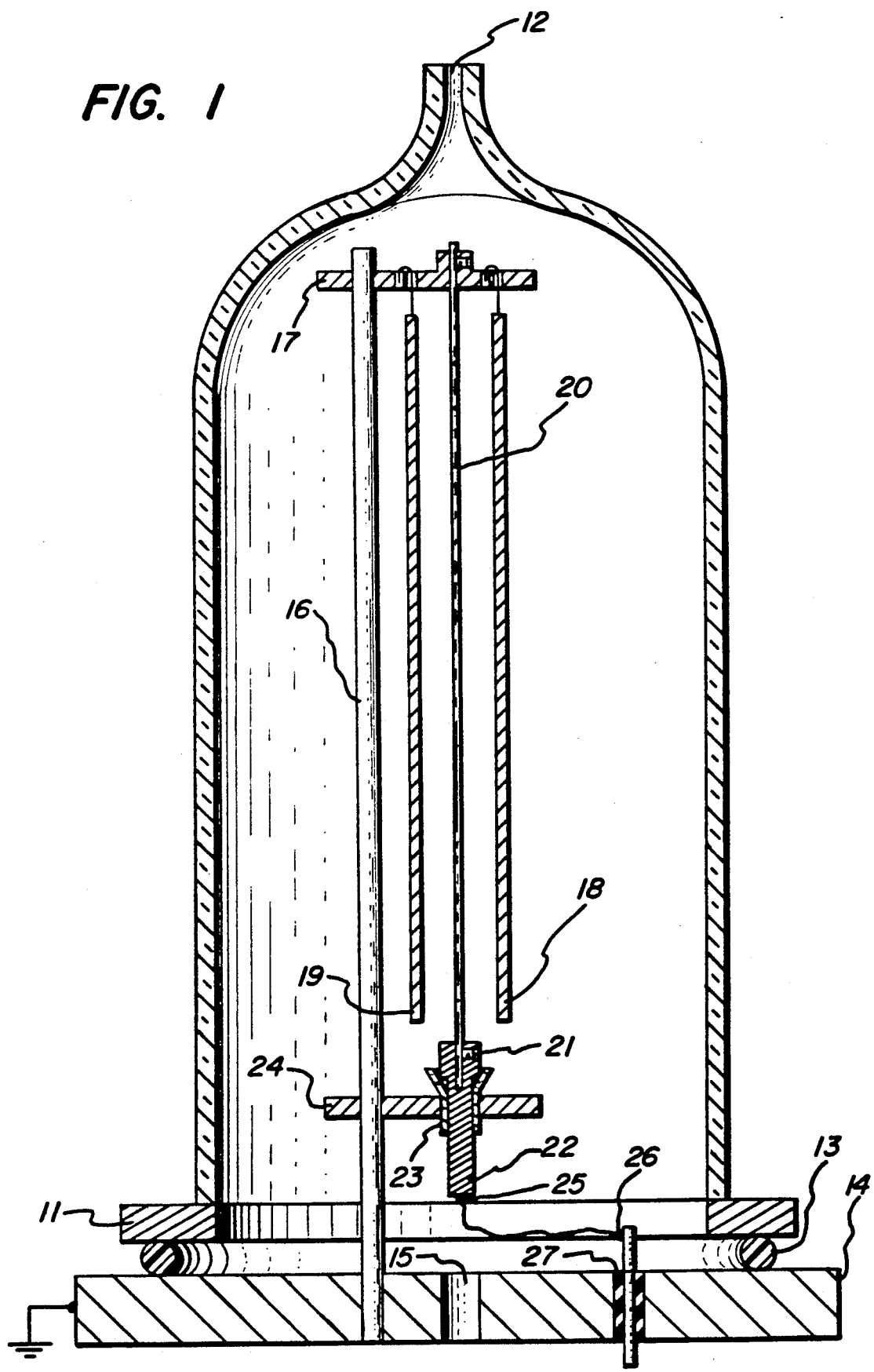
FIG. 1 shows a quartz bell jar having a metal flange which rests on a base. Inside the quartz bell jar, there is shown a support structure for a filament and several adjacent substrate sections.

A mixture of 1.75 volume % of methane and 98.25 volume % of hydrogen, measured under atmospheric conditions, was introduced into a reaction vessel as shown by FIG. 1. A gas flow rate of about 400 cubic centimeters per minute was maintained. There was used two $1\frac{1}{4}'' \times \frac{1}{4}'' \times 9''$ molybdenum substrates and a 9 ½#218 tungsten filament having a diameter of 0.030''. The tungsten filament was maintained at a temperature between about 2020° to 2040° C. A separation of about 7-8 millimeters was maintained between the filament and the molybdenum substrate during the deposition which lasted approximately 30 days. The substrate temperature was estimated at about 800° C. during the deposition period.

At the termination of the 30 day deposition period, the apparatus was allowed to cool to room temperature. Transparent polycrystalline diamond films having thicknesses of about 500 microns and lateral dimensions equivalent to the substrates separated from the substrate during the cooling period.

The diamond films were found to be of good crystalline quality as shown by Raman spectra having an intense peak at 1332 cm$^{-1}$. The diamond films were also found to have the characteristic two phonon adsorption of material diamond in the range of 1600-2650 cm$^{-1}$ by infrared spectroscopy.

Although the above example is directed to only a few of the very many variables which can be used in the practice of the method of the present invention to make the polycrystalline diamond films, it should be understood that a much broader variety of conditions, apparatus arrangements and materials can be used as set forth in the description preceding this example.

What is claimed is:

1. A continuous free-standing, transparent, polycrystalline diamond film having a thickness of at least 50 microns comprising (A) substantially vertical columnar diamond crystals having a <110> orientation perpendicular to the base and up to 10,000 parts per million of chemically combined hydrogen which is sufficient to substantially saturate dangling carbon bonds at diamond crystal grain boundaries, carbon dislocations, and carbon valence vacancies and (B) diamond crystal grain boundaries separating the columnar diamond crystals of (A) where the diamond crystal grain boundaries have a 70°-90° orientation to the diamond crystal base.

2. A transparent polycrystalline diamond film in accordance with claim 1, where the film thickness is 500 microns.

3. A transparent polycrystalline diamond film in accordance with claim 1, where the film thickness is greater than 500 and up to 5000 microns.

4. A method of growing a continuous free standing, non-adherent transparent polycrystalline film on the surface of a substrate, which diamond film has a thickness of at least 50 microns, comprising, passing a hydrogen-methane mixture at a pressure of about 3 to about 24 torr through a heated filament reaction zone which is sufficient to generate active carbon-hydrogen species and provide a temperature of about 600° C. to 1000° C. on the surface of the substrate which is maintained at a distance of from about 0.3 to about 1 centimeter from the heated filament, where the hydrogen-methane mixture introduced into the heated filament reaction zone has from about 1.5 to about 2 volume % of methane based on the total volume of hydrogen and methane.

5. A method in accordance with claim 4, where the substrate is a molybdenum substrate.

* * * * *